US010324787B2

(12) United States Patent
Lin et al.

(10) Patent No.: US 10,324,787 B2
(45) Date of Patent: Jun. 18, 2019

(54) DECODING METHOD, MEMORY STORAGE DEVICE AND MEMORY CONTROL CIRCUIT UNIT

(71) Applicant: PHISON ELECTRONICS CORP., Miaoli (TW)

(72) Inventors: Yu-Hsiang Lin, Yunlin County (TW); Shao-Wei Yen, Kaoshiung (TW); Yu-Siang Yang, New Taipei (TW); Kuo-Hsin Lai, Hsinchu County (TW)

(73) Assignee: PHISON ELECTRONICS CORP., Miaoli (TW)

( * ) Notice: Subject to any disclaimer, the term of this patent is extended or adjusted under 35 U.S.C. 154(b) by 31 days.

(21) Appl. No.: 15/831,405

(22) Filed: Dec. 5, 2017

(65) Prior Publication Data

US 2019/0114227 A1   Apr. 18, 2019

(30) Foreign Application Priority Data

Oct. 12, 2017   (TW) .............................. 106134944 A

(51) Int. Cl.
| | | |
|---|---|---|
| *G11C 29/00* | (2006.01) | |
| *G06F 11/10* | (2006.01) | |
| *G11C 29/52* | (2006.01) | |
| *G11C 29/42* | (2006.01) | |

(52) U.S. Cl.
CPC ...... *G06F 11/1068* (2013.01); *G06F 11/1012* (2013.01); *G11C 29/42* (2013.01); *G11C 29/52* (2013.01)

(58) Field of Classification Search
CPC ............ G06F 11/1068; G06F 11/1012; G06F 11/1048; G11C 29/52; G11C 29/42
USPC ......................... 714/764, 755, 780, 799, 746
See application file for complete search history.

(56) References Cited

U.S. PATENT DOCUMENTS

| | | | |
|---|---|---|---|
| 8,522,119 B2* | 8/2013 | Dick ..................... | H04L 1/0051 341/94 |
| 2013/0219108 A1* | 8/2013 | Yang ................... | G06F 11/1068 711/103 |
| 2017/0141877 A1* | 5/2017 | Ikegaya ................ | H03M 13/27 |

* cited by examiner

*Primary Examiner* — Christine T. Tu
(74) *Attorney, Agent, or Firm* — JCIPRNET

(57) ABSTRACT

A decoding method is provided according to an exemplary embodiment of the invention. The decoding method includes: reading a data set from at least two physical units of a rewritable non-volatile memory module by using at least one read voltage level; performing a first-type decoding operation for first data by using the data set and recording decoding information of the first-type decoding operation if the data set conforms to a default condition; adjusting reliability information corresponding to the first data according to the recorded decoding information, and the reliability information is not used in the first-type decoding operation, and the adjusted reliability information is different from default reliability information corresponding to the first data; and performing a second-type decoding operation for the first data according to the adjusted reliability information.

27 Claims, 13 Drawing Sheets

DECODING METHOD, MEMORY STORAGE DEVICE AND MEMORY CONTROL CIRCUIT UNIT

CROSS-REFERENCE TO RELATED APPLICATION

This application claims the priority benefit of Taiwan application serial no. 106134944, filed on Oct. 12, 2017. The entirety of the above-mentioned patent application is hereby incorporated by reference herein and made a part of this specification.

BACKGROUND

Technical Field

The invention relates to a decoding technology, and more particularly, to a decoding method, a memory storage device and a memory control circuit unit.

Description of Related Art

The markets of digital cameras, cellular phones, and MP3 players have expanded rapidly in recent years, resulting in escalated demand for storage media by consumers. The characteristics of data non-volatility, low power consumption, and compact size make a rewritable non-volatile memory module (e.g., flash memory) ideal to be built in the portable multi-media devices as cited above.

Data exists in memory cells of the rewritable non-volatile memory module in form of charges. In use of the rewritable non-volatile memory module, the charges in the memory cells may be lost due to various factors, resulting in errors occurred on the memory cells being read. Accordingly, in some memory storage devices, the data from a host system is encoded and then being stored. When the host system intends to read such data, the encoded data is read and decoded so as to correct the errors therein. Then, the data being decoded and checked as correct is transmitted to the host system. Further, some types of the memory storage devices can support data encoding and decoding across pages or across word lines in order to improve an error correction capability for the stored data. However, in the case where to-be-decoded data has too many errors, there is a great chance that the data encoding and decoding across pages or across word lines will fail.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

An exemplary embodiment of the invention provides a decoding method, a memory storage device and a memory control circuit unit, which are capable of improving a decoding efficiency of a data protection mechanism across physical units.

An exemplary embodiment of the invention provides a decoding method for a rewritable non-volatile memory module. The rewritable non-volatile memory module includes a plurality of physical units. The decoding method includes: reading a data set from at least two physical units among the physical units by using at least one read voltage level; performing a first-type decoding operation for first data by using the data set and recording decoding information of the first-type decoding operation if the data set conforms to a default condition; adjusting reliability information corresponding to the first data according to the decoding information of the first-type decoding operation, wherein the reliability information corresponding to the first data is not used in the first-type decoding operation, and the adjusted reliability information is different from default reliability information corresponding to the first data; and performing a second-type decoding operation for the first data according to the adjusted reliability information.

Another exemplary embodiment of the invention provides a memory storage device, which includes a connection interface unit, a rewritable non-volatile memory module and a memory control circuit unit. The connection interface unit is configured to couple to a host system. The rewritable non-volatile memory module includes a plurality of physical units. The memory control circuit unit is coupled to the connection interface unit and the rewritable non-volatile memory module. The memory control circuit unit is configured to give an instruction for reading a data set from at least two physical units among the physical units by using at least one read voltage level. The memory control circuit unit is further configured to perform a first-type decoding operation for first data by using the data set and record decoding information of the first-type decoding operation if the data set conforms to a default condition. The memory control circuit unit is further configured to adjust reliability information corresponding to the first data according to the decoding information of the first-type decoding operation. The reliability information corresponding to the first data is not used in the first-type decoding operation, and the adjusted reliability information is different from default reliability information corresponding to the first data. The memory control circuit unit is further configured to perform a second-type decoding operation for the first data according to the adjusted reliability information.

Another exemplary embodiment of the invention provides a memory control circuit unit, which is configured to control a rewritable non-volatile memory module. The rewritable non-volatile memory module includes a plurality of physical units. The memory control circuit unit includes a host interface, a memory interface, an error checking and correcting circuit, and a memory management circuit. The host interface is configured to couple to a host system. The memory interface is configured to couple to the rewritable non-volatile memory module. The memory management circuit is coupled to the host interface, the memory interface and the error checking and correcting circuit. The memory management circuit is configured to give an instruction for reading a data set from at least two physical units among the physical units by using at least one read voltage level. The error checking and correcting circuit is configured to perform a first-type decoding operation for first data by using the data set and record decoding information of the first-type decoding operation if the data set conforms to a default condition. The memory management circuit is further configured to adjust reliability information corresponding to the first data according to the decoding information of the first-type decoding operation. The reliability information corresponding to the first data is not used in the first-type decoding operation, and the adjusted reliability information is different from default reliability information corresponding to the first data. The memory management circuit is further configured to perform a second-type decoding operation for the first data according to the adjusted reliability information.

Based on the above, after the data set is read from the at least two physical units, the data set can be used in the first-type decoding operation in order to decode the first data and the decoding information of the first-type decoding operation can be recorded. Then, according to the recorded decoding information, the reliability information corresponding to the first data can be adjusted, and the adjusted reliability information can be used in the subsequent second-type decoding operation for the first data. As a result, the decoding efficiency of the data protection mechanism across physical units may be improved.

To make the above features and advantages of the disclosure more comprehensible, several embodiments accompanied with drawings are described in detail as follows.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
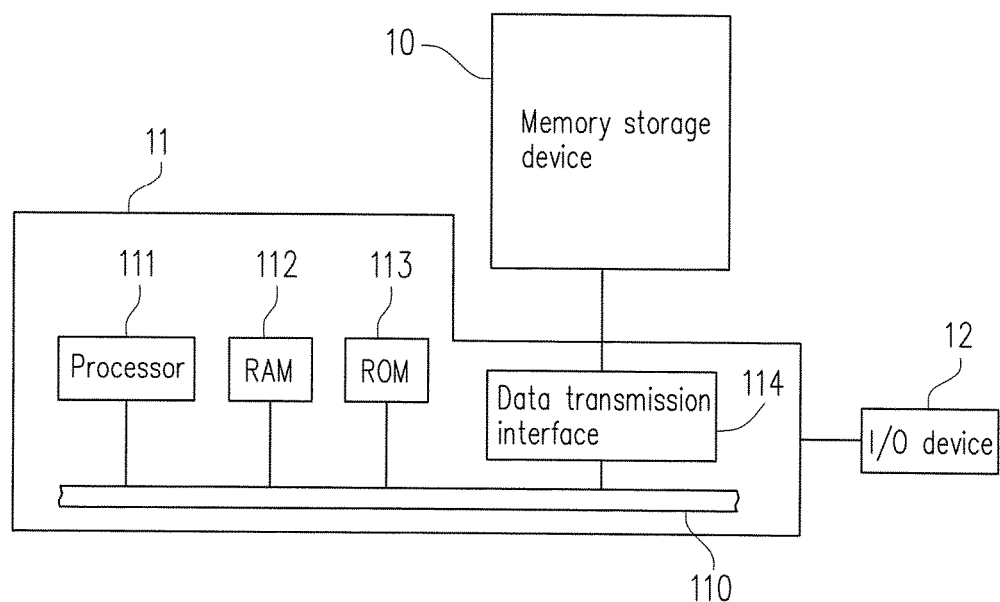
FIG. 1 is a schematic diagram illustrating a host system, a memory storage device and an I/O (input/output) device according to an exemplary embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

In general, a memory storage device (a.k.a. a memory storage system) includes a rewritable non-volatile memory module and a controller (a.k.a. a control circuit). The memory storage device usually operates together with a host system so the host system can write data into the memory storage device or read data from the memory storage device.

Figure 2:
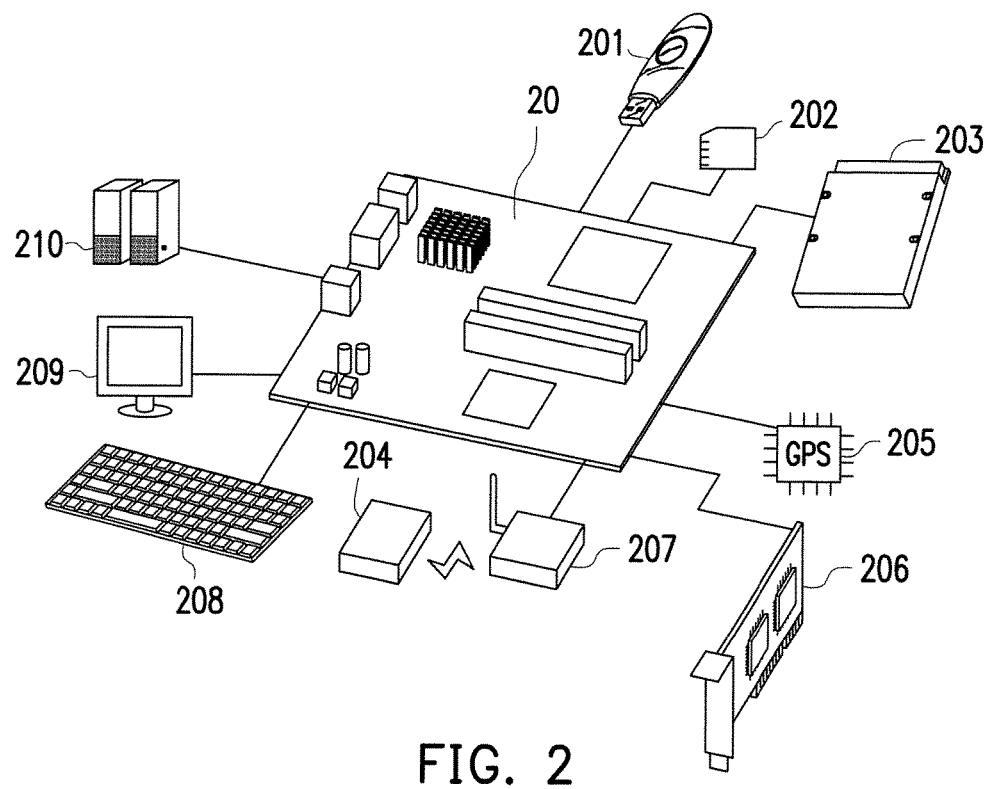
FIG. 2 is a schematic diagram illustrating a host system, a memory storage device and an I/O device according to another exemplary embodiment of the invention.

FIG. 1 is a schematic diagram illustrating a host system, a memory storage device and an I/O (input/output) device according to an exemplary embodiment of the invention. FIG. 2 is a schematic diagram illustrating a host system, a memory storage device and an I/O device according to another exemplary embodiment of the invention.

Referring to FIG. 1 and FIG. 2, a host system 11 generally includes a processor 111, a RAM (random access memory) 112, a ROM (read only memory) 113 and a data transmission interface 114. The processor 111, the RAM 112, the ROM 113 and the data transmission interface 114 are coupled to a system bus 110.

In the present exemplary embodiment, the host system 11 is coupled to a memory storage device 10 through the data transmission interface 114. For example, the host system 11 can store data into the memory storage device 10 or read data from the memory storage device 10 through the data transmission interface 114. Further, the host system 11 is coupled to an I/O device 12 via the system bus 110. For example, the host system 11 can transmit output signals to the I/O device 12 or receive input signals from the I/O device 12 via the system bus 110.

In the present exemplary embodiment, the processor 111, the RAM 112, the ROM 113 and the data transmission interface 114 may be disposed on a main board 20 of the host system 11. The number of the data transmission interfaces 114 may be one or more. Through the data transmission interface 114, the main board 20 may be coupled to the memory storage device 10 in a wired manner or a wireless manner. The memory storage device 10 may be, for example, a flash drive 201, a memory card 202, a SSD (Solid State Drive) 203 or a wireless memory storage device 204. The wireless memory storage device 204 may be, for example, a memory storage device based on various wireless communication technologies, such as a NFC (Near Field Communication) memory storage device, a WiFi (Wireless Fidelity) memory storage device, a Bluetooth memory storage device, a BLE (Bluetooth low energy) memory storage device (e.g., iBeacon). Further, the main board 20 may also be coupled to various I/O devices including a GPS (Global Positioning System) module 205, a network interface card 206, a wireless transmission device 207, a keyboard 208, a monitor 209 and a speaker 210 through the system bus 110. For example, in an exemplary embodiment, the main board 20 can access the wireless memory storage device 204 via the wireless transmission device 207.

Figure 3:
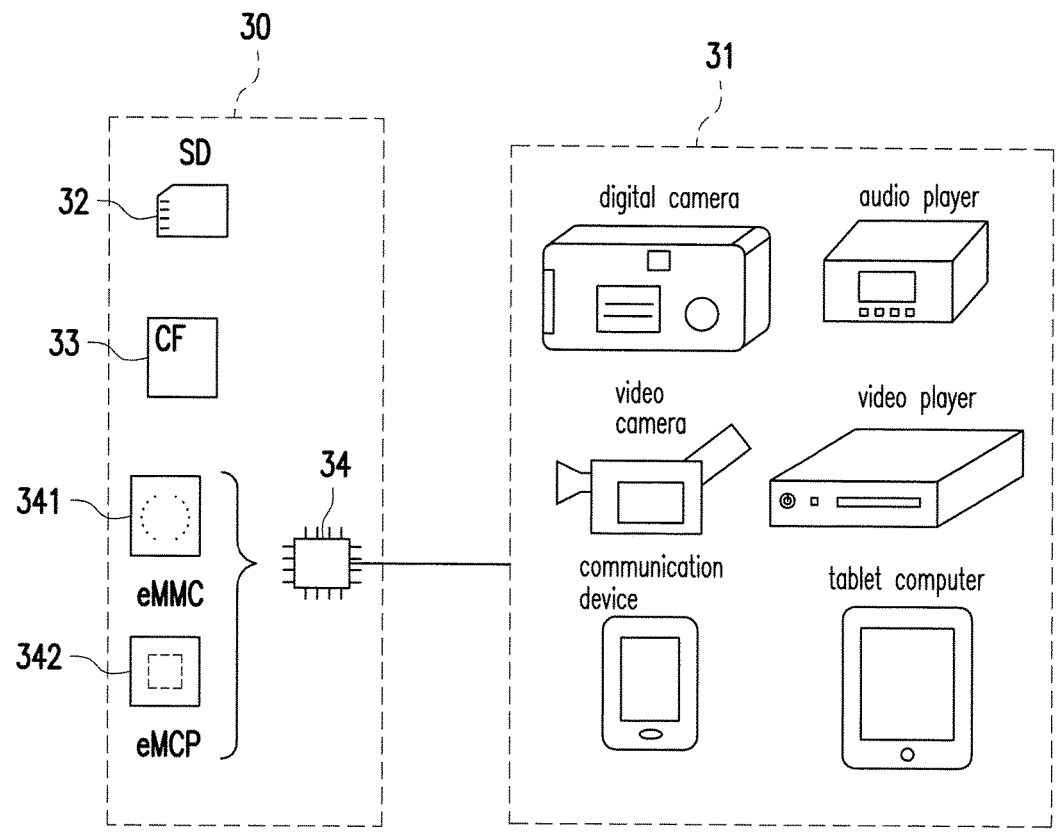
FIG. 3 is a schematic diagram illustrating a host system and a memory storage device according to another exemplary embodiment of the invention.

In an exemplary embodiment, aforementioned host system may be any system capable of substantially cooperating with the memory storage device for storing data. Although the host system is illustrated as a computer system in the foregoing exemplary embodiment, nonetheless, FIG. 3 is a schematic diagram illustrating a host system and a memory storage device according to another exemplary embodiment of the invention. Referring to FIG. 3, in another exemplary embodiment, a host system 31 may also be a system such as a digital camera, a video camera, a communication device, an audio player, a video player or a tablet computer, whereas a memory storage device 30 may be various non-volatile memory storage devices used by the host system 31, such as a SD (Secure Digital) card 32, a CF (Compact Flash) card 33 or an embedded storage device 34. The embedded storage device 34 includes various embedded storage devices capable of directly coupling a memory module onto a substrate of the host system, such as an eMMC (embedded Multi Media Card) 341 and/or an eMCP (embedded Multi Chip Package) storage device 342.

Figure 4:
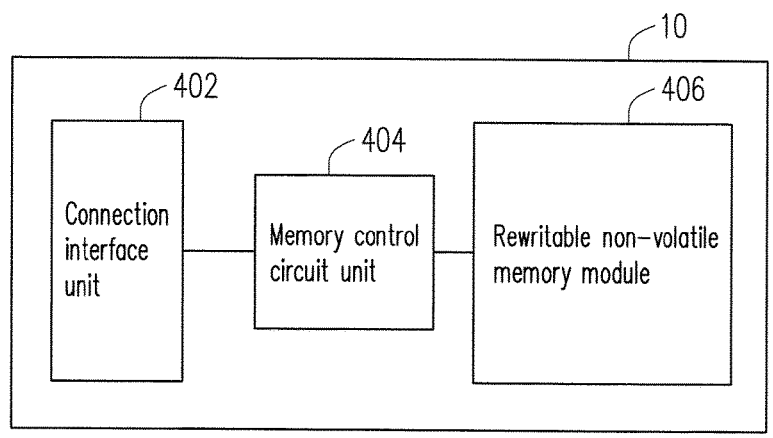
FIG. 4 is a schematic block diagram illustrating a memory storage device according to an exemplary embodiment of the invention.

FIG. 4 is a schematic block diagram illustrating a memory storage device according to an exemplary embodiment of the invention.

Referring to FIG. 4, the memory storage device 10 includes a connection interface unit 402, a memory control circuit unit 404 and a rewritable non-volatile memory module 406.

The connection interface unit 402 is configured to couple the memory storage device 10 to the host system 11. In the present exemplary embodiment, the connection interface unit 402 is compatible with a SATA (Serial Advanced Technology Attachment) standard. Nevertheless, it should be understood that the invention is not limited to the above. The connection interface unit 402 may also be compatible with a PATA (Parallel Advanced Technology Attachment) standard, an IEEE (Institute of Electrical and Electronic Engineers) 1394 standard, a PCI Express (Peripheral Component Interconnect Express) interface standard, a USB (Universal Serial Bus) standard, a SD interface standard, a UHS-I (Ultra High Speed-I) interface standard, a UHS-II (Ultra High Speed-II) interface standard, a MS (Memory Stick) interface standard, a MCP interface standard, a MMC interface standard, an eMMC interface standard, a UFS (Universal Flash Storage) interface standard, an eMCP interface standard, a CF interface standard, an IDE (Integrated Device Electronics) interface standard or other suitable standards. The connection interface unit 402 and the memory control circuit unit 404 may be packaged into one chip, or the connection interface unit 402 may be distributed outside of a chip containing the memory control circuit unit 404.

The memory control circuit unit 404 is configured to execute a plurality of logic gates or control commands which are implemented in a hardware form or in a firmware form and perform operations, such as writing, reading or erasing data in the rewritable non-volatile memory module 406 according to the commands of the host system 11.

The rewritable non-volatile memory module 406 is coupled to the memory control circuit unit 404 and configured to store data written from the host system 11. The rewritable non-volatile memory module 406 may be a SLC (Single Level Cell) NAND flash memory module (i.e., a flash memory module capable of storing one bit in one memory cell), a MLC (Multi Level Cell) NAND flash memory module (i.e., a flash memory module capable of storing two bits in one memory cell), a TLC (Triple Level Cell) NAND flash memory module (i.e., a flash memory module capable of storing three bits in one memory cell), other flash memory modules or any memory module having the same features.

In the rewritable non-volatile memory module 406, one or more bits are stored by changing a voltage (hereinafter, also known as a threshold voltage) of each of the memory cells. More specifically, in each of the memory cells, a charge trapping layer is provided between a control gate and a channel. Amount of electrons in the charge trapping layer may be changed by applying a write voltage to the control gate thereby changing the threshold voltage of the memory cell. This operation of changing the threshold voltage of the memory cell is also known as "writing data into the memory cell" or "programming the memory cell". By changing the threshold voltage, each of the memory cells in the rewritable non-volatile memory module 406 can have a plurality of storage states. The storage state to which the memory cell belongs may be determined by applying a read voltage to the memory cell, so as to obtain the one or more bits stored in the memory cell.

In the present exemplary embodiment, the memory cells of the rewritable non-volatile memory module 406 constitute a plurality of physical programming units, and the physical programming units constitute a plurality of physical erasing units. Specifically, the memory cells on the same word line constitute one or more of the physical programming units. If each of the memory cells can store two or more bits, the physical programming units on the same word line can be at least classified into a lower physical programming unit and an upper physical programming unit. For instance, a least significant bit (LSB) of one memory cell belongs to the lower physical programming unit, and a most significant bit (MSB) of one memory cell belongs to the upper physical programming unit. In general, in the MLC NAND flash memory, a writing speed of the lower physical programming unit is higher than a writing speed of the upper physical programming unit, and/or a reliability of the lower physical programming unit is higher than a reliability of the upper physical programming unit.

In the present exemplary embodiment, the physical programming unit is the minimum unit for programming. That is, the physical programming unit is the minimum unit for writing data. For example, the physical programming unit is a physical page or a physical sector. If the physical programming unit is the physical page, these physical programming units usually include a data bit area and a redundancy bit area. The data bit area includes multiple physical sectors configured to store user data, and the redundant bit area is configured to store system data (e.g., management data such as an error correcting code, etc.). In the present exemplary embodiment, the data bit area includes 32 physical sectors, and a size of each physical sector is 512 bytes (B). However, in other exemplary embodiments, the data bit area may also include 8, 16 physical sectors or different number (more or less) of the physical sectors, and the size of each physical sector may also be greater or smaller. On the other hand, the physical erasing unit is the minimum unit for erasing. Namely, each physical erasing unit contains the least number of memory cells to be erased together. For instance, the physical erasing unit is a physical block.

Figure 5:
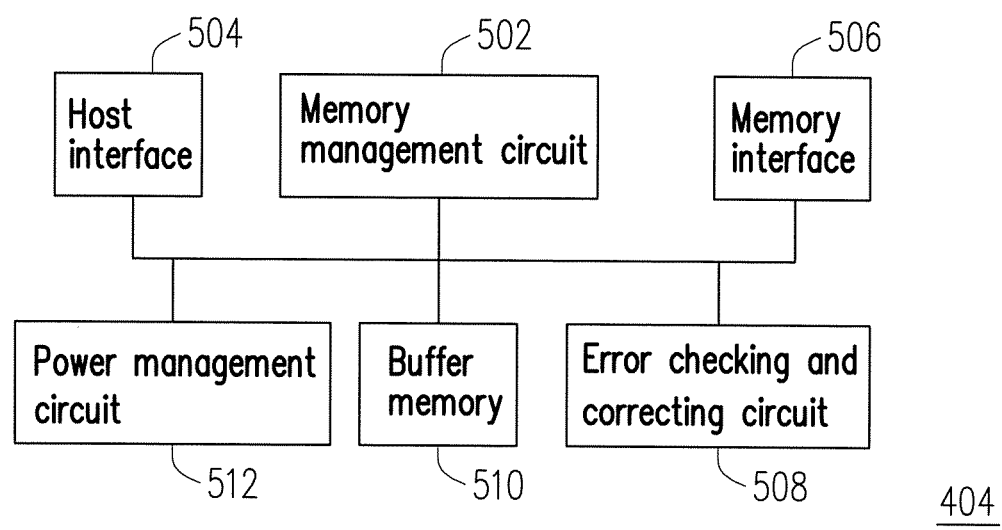
FIG. 5 is a schematic block diagram illustrating a memory control circuit unit according to an exemplary embodiment of the invention.

FIG. 5 is a schematic block diagram illustrating a memory control circuit unit according to an exemplary embodiment of the invention.

Referring to FIG. 5, the memory control circuit unit 404 includes a memory management circuit 502, a host interface 504, a memory interface 506 and an error checking and correcting circuit 508.

The memory management circuit 502 is configured to control overall operations of the memory control circuit unit 404. Specifically, the memory management circuit 502 has a plurality of control commands. When the memory storage device 10 operates, the control commands are executed to perform various operations such as data writing, data reading and data erasing. Hereinafter, operations of the memory management circuit 502 are described as equivalent to operations of the memory control circuit unit 404.

In the present exemplary embodiment, the control commands of the memory management circuit 502 are implemented in a firmware form. For instance, the memory management circuit 502 has a microprocessor unit (not illustrated) and a read-only memory (not illustrated), and the control commands are burnt into the read-only memory. When the memory storage device 10 operates, the control commands are executed by the microprocessor to perform operations of writing, reading or erasing data.

In another exemplary embodiment, the control commands of the memory management circuit 502 may also be stored as program codes in a specific area (for example, the system area in a memory exclusively used for storing system data) of the rewritable non-volatile memory module 406. In addition, the memory management circuit 502 has a microprocessor unit (not illustrated), a ROM (not illustrated) and a RAM (not illustrated). More particularly, the ROM has a boot code, which is executed by the microprocessor unit to load the control commands stored in the rewritable non-volatile memory module 406 to the RAM of the memory management circuit 502 when the memory control circuit unit 404 is enabled. Then, the control commands are executed by the microprocessor unit to perform operations, such as writing, reading or erasing data.

Further, in another exemplary embodiment, the control commands of the memory management circuit 502 may also be implemented in a faun of hardware. For example, the memory management circuit 502 includes a microprocessor, a memory cell management circuit, a memory writing circuit, a memory reading circuit, a memory erasing circuit and a data processing circuit. The memory cell management circuit, the memory writing circuit, the memory reading circuit, the memory erasing circuit and the data processing circuit are coupled to the microprocessor. The memory cell management circuit is configured to manage the memory cells of the rewritable non-volatile memory module 406 or a group thereof. The memory writing circuit is configured to give a write command sequence for the rewritable non-volatile memory module 406 in order to write data into the rewritable non-volatile memory module 406. The memory reading circuit is configured to issue a read command sequence for the rewritable non-volatile memory module 406 in order to read data from the rewritable non-volatile memory module 406. The memory erasing circuit is configured to issue an erase command sequence for the rewritable non-volatile memory module 406 in order to erase data from the rewritable non-volatile memory module 406. The data processing circuit is configured to process both the data to be written into the rewritable non-volatile memory module 406 and the data read from the rewritable non-volatile memory module 406. Each of the write command sequence, the read command sequence and the erase command sequence may include one or more program codes or command codes, and instruct the rewritable non-volatile memory module 406 to perform the corresponding operations, such as writing, reading and erasing. In an exemplary embodiment, the memory management circuit 502 may further give command sequence of other types to the rewritable non-volatile memory module 406 for instructing to perform the corresponding operations.

The host interface 504 is coupled to the memory management circuit 502 and configured to receive and identify commands and data sent from the host system 11. In other words, the commands and data transmitted by the host system 11 are transmitted to the memory management circuit 502 via the host interface 504. In the present exemplary embodiment, the host interface 504 is compatible with the SATA standard. However, it should be understood that the present invention is not limited thereto, and the host interface 504 may also be compatible with the PATA standard, the IEEE 1394 standard, the PCI Express standard, the USB standard, the SD standard, the UHS-I standard, the UHS-II standard, the MS standard, the MMC standard, the eMMC standard, the UFS standard, the CF standard, the IDE standard, or other suitable standards for data transmission.

The memory interface 506 is coupled to the memory management circuit 502 and configured to access the rewritable non-volatile memory module 406. In other words, data to be written into the rewritable non-volatile memory module 406 is converted into a format acceptable by the rewritable non-volatile memory module 406 via the memory interface 506. Specifically, if the memory management circuit 502 intends to access the rewritable non-volatile memory module 406, the memory interface 506 sends corresponding command sequences. For example, the command sequences may include the write command sequence carrying an instruction for writing data, the read command sequence carrying an instruction for reading data, the erase command sequence carrying an instruction for erasing data, and other corresponding command sequences carrying instructions for performing various memory operations (e.g., changing read voltage levels or performing a garbage collection procedure). These command sequences are generated by the memory management circuit 502 and transmitted to the rewritable non-volatile memory module 406 through the memory interface 506, for example. The command sequences may include one or more signals, or data transmitted in the bus. The signals or the data may include command codes and program codes. For example, information such as identification codes and memory addresses are included in the read command sequence.

The error checking and correcting circuit 508 is coupled to the memory management circuit 502 and configured to perform an error checking and correcting operation to ensure the correctness of data. Specifically, when the memory management circuit 502 receives the write command from the host system 11, the error checking and correcting circuit 508 generates an ECC (error correcting code) and/or an EDC (error detecting code) for data corresponding to the write command, and the memory management circuit 502 writes data corresponding to the write command and the corresponding ECC and/or the EDC into the rewritable non-volatile memory module 406. Then, when the memory management circuit 502 reads the data from the rewritable non-volatile memory module 406, the corresponding ECC and/or the EDC are also read, and the error checking and correcting circuit 508 performs the error checking and correcting operation on the read data based on the ECC and/or the EDC.

In an exemplary embodiment, the memory control circuit unit 404 further includes a buffer memory 510 and a power management circuit 512. The buffer memory 510 is coupled to the memory management circuit 502 and configured to temporarily store data and commands from the host system 11 or data from the rewritable non-volatile memory module 406. The power management unit 512 is coupled to the memory management circuit 502 and configured to control a power of the memory storage device 10.

Figure 6:
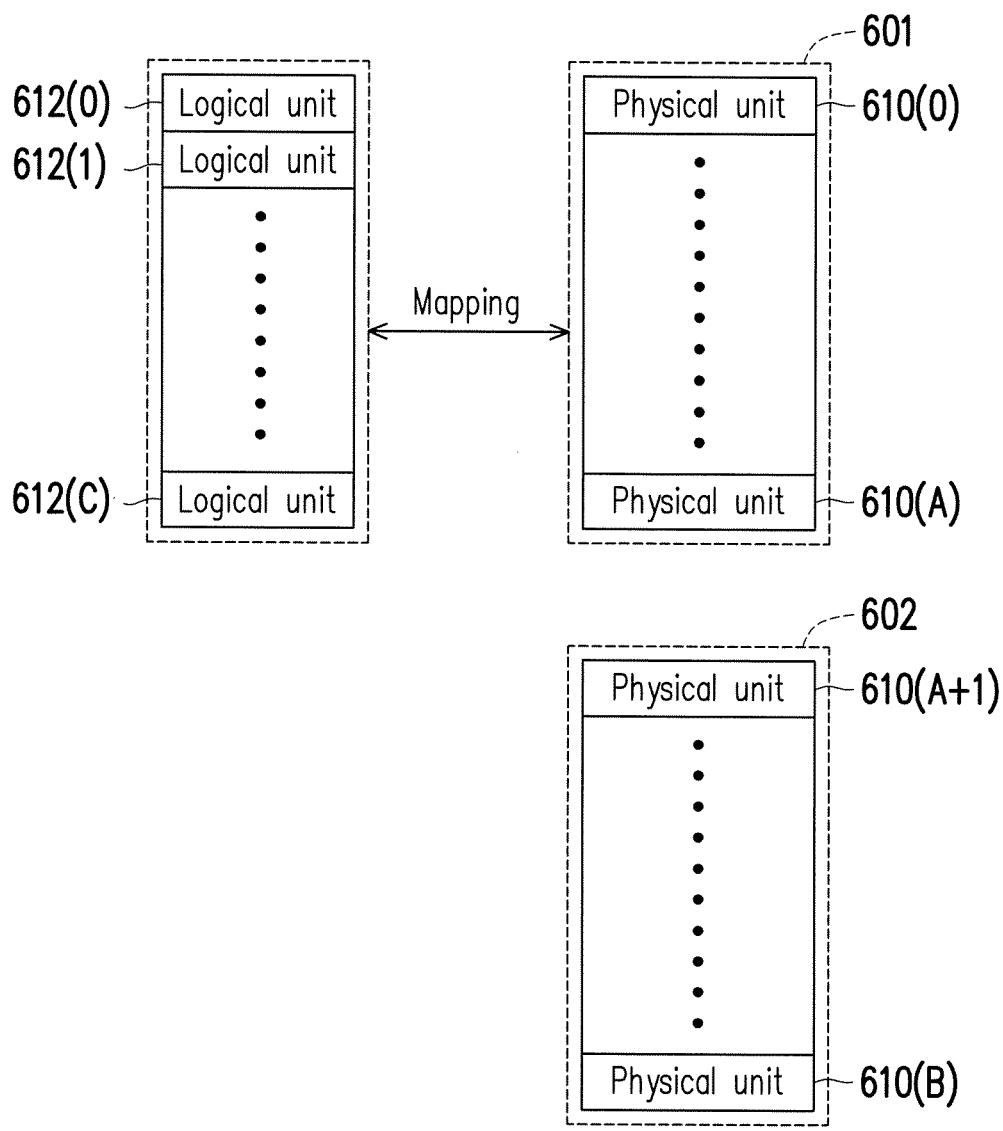
FIG. 6 is a schematic diagram illustrating management of a rewritable non-volatile memory module according to an exemplary embodiment of the invention.

FIG. 6 is a schematic diagram illustrating management of a rewritable non-volatile memory module according to an exemplary embodiment of the invention.

Referring to FIG. 6, the memory management circuit 502 logically groups physical units 610(0) to 610(B) of the rewritable non-volatile memory module 406 into a storage area 601 and a replacement area 602. The physical units 610(0) to 610(A) in the storage area 601 are configured to store data, and the physical units 610(A+1) to 610(B) in the replacement area 602 are configured to replace damaged physical units in the storage area 601. For example, if data read from one specific physical unit includes too many errors and these errors cannot be corrected, the specific physical unit may be regarded as a damaged physical unit. It is noted that, if there are no available physical erasing units in the replacement area 602, the memory management circuit 502 may declare the memory storage device 10 as in a write protect state so data can no longer be written thereto.

In the present exemplary embodiment, each physical unit refers to one physical programming unit. However, in another exemplary embodiment, one physical unit may also refer to one physical address, one physical erasing unit, or a composition of a plurality of continuous or discontinuous physical addresses. The memory management circuit 502 assigns logical units 612(0) to 612(C) for mapping to the physical units 610(0) to 610(A) in the storage area 601. In the present exemplary embodiment, each logical unit refers to one logical address. However, in another exemplary embodiment, each logical unit may also refer to one logical programming unit, one logical erasing unit or a composition of a plurality of continuous or discontinuous logical addresses. In addition, each of the logical units 612(0) to 612(C) may also be mapped to one or more physical units.

The memory management circuit 502 records a mapping relation (a.k.a. a logical-physical address mapping relation) between the logical units and the physical units into at least one logical-physical address mapping table. When the host system 11 intends to read data from the memory storage device 10 or write data into the memory storage device 10, the memory management circuit 502 can perform a data accessing operation on the memory storage device 10 according to the logical-physical address mapping table.

In the present exemplary embodiment, a basic unit of an encoding operation performed by the error checking and correcting circuit 508 is one frame (a.k.a. a decoding frame). One frame includes a plurality of data bits. In this exemplary embodiment, one frame includes 256 bits. However, in another exemplary embodiment, one frame may also include more (e.g., 4K bytes) or less bits.

In the present exemplary embodiment, the error checking and correcting circuit 508 can perform single-frame encoding and decoding for data stored in the same physical unit, and the error checking and correcting circuit 508 can also perform multi-frame encoding and decoding for data stored in multiple physical units. Each of the single-frame encoding and the multi-frame encoding may adopt encoding algorithms including at least one of a LDPC (low density parity check) code, a BCH code, a convolutional code or a turbo code. Alternatively, in another exemplary embodiment, the multi-frame encoding may also adopt RS codes (Reed-solomon codes) algorithm or an XOR (Exclusive OR) encoding. Further, in another exemplary embodiment, more of other encoding algorithms not listed above may also be adopted, which are omitted herein. According to the adopted encoding algorithm, the error checking and correcting circuit 508 can encode the data to be protected, so as to generate the corresponding ECC and/or the EDC. Later, the error correcting code and/or the error detection code generated by encoding may be used to correct errors in the data to be protected. For clear description, the ECC and/or the EDC generated by encoding are collectively known as parity data.

It is noted that in the following description, some terms may be replaced with corresponding abbreviations for ease of reading (see Table 1).

TABLE 1

| | |
|---|---|
| physical unit | PU |
| rewritable non-volatile memory module | RNVM module |
| memory management circuit | MMC |
| error checking and correcting circuit | ECCC |

Figure 7:
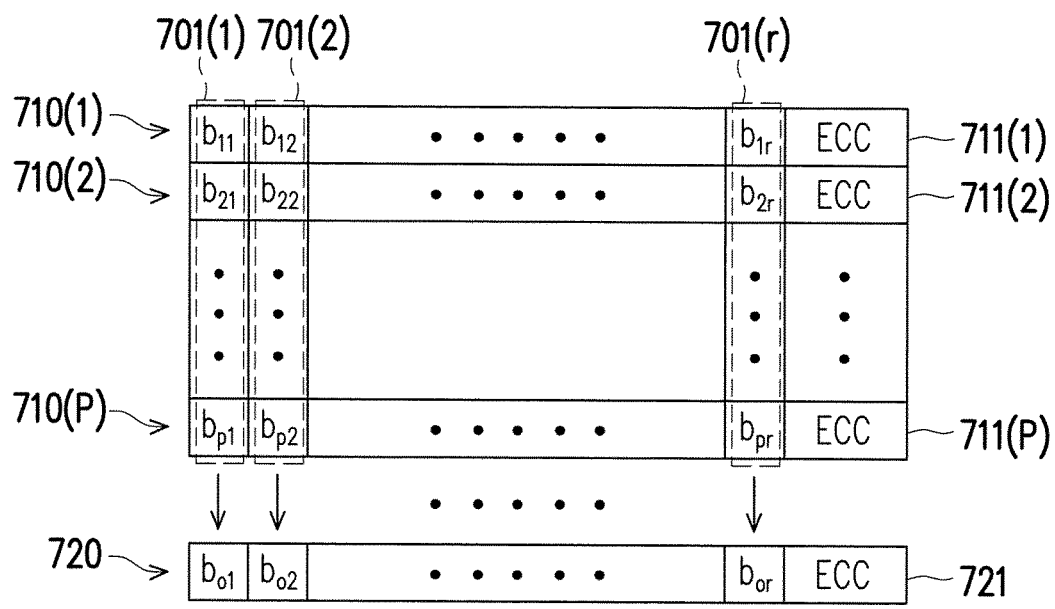
FIG. 7 is a schematic diagram illustrating a multi-frame encoding according to an exemplary embodiment of the invention.

FIG. 7 is a schematic diagram illustrating a multi-frame encoding according to an exemplary embodiment of the invention.

With reference to FIG. 7, each of data 710(1) to 710(P) may be regarded as one frame. Each of the data 710(1) to 710(P) may also include one or more data units. The data 710(1) to 710(P) are respectively stored in the different PUs. For example, the data 710(1) to 710(P) may be respectively stored in the different physical programming units on the same word line, the physical programming units on the different word lines, the physical programming units on different dies, the physical programming units on different planes, or the physical programming units on different chip enables (CE).

In the multi-frame encoding corresponding to the data 710(0) to 710(P), the data 710(0) to 710(P) are encoded based on a position under which each bit (or byte) is located. For example, bits $b_{11}, b_{21}, \ldots, b_{p1}$ located under a position 701(1) are encoded as a bit $b_{o1}$ in parity data 720, and bits $b_{12}, b_{22}, \ldots, b_{p2}$ located under a position 701(2) are encoded as a bit $b_{o2}$ in the parity data 720; by analogy, bits $b_{1r}, b_{2r}, \ldots, b_{pr}$ under a position 701(r) are encoded as a bit $b_{or}$ in the parity data 720. In the multi-frame decoding, based on the parity data 720, the data 710(1) to 710(P) so as to correct errors possibly existing in the data 710(1) to 710(P).

In an exemplary embodiment, if a single-frame encoding is performed for each of the data 710(1) to 710(P) and the parity data 720, error correcting codes (and/or error detection codes) 711(1) to 711(P) and 721 may be respectively generated. For example, in the single-frame encoding corresponding to the data 710(1), the bits $b_{11}, b_{12}, \ldots, b_{1r}$ are encoded into the error correcting code 711(1); in the single-frame encoding corresponding to the data 710(2), the bits $b_{21}, b_{22}, \ldots, b_{2r}$ are encoded into the error correcting code 711(2); in the single-frame encoding corresponding to the data 710(P), the bits $b_{p1}, b_{p2}, \ldots b_{pr}$ are encoded into the error correcting code 711(P); and in the single-frame encoding corresponding to the parity data 720, the bits $b_{o1}, b_{o2}, \ldots b_{or}$ are encoded into the error correcting code 721. In the single-frame decoding, the error correcting code 711(1) may be used to decode the data 710(1); the error correcting code 711(2) may be used to decode the data 710(2); the error correcting code 711(P) may be used to decode the data 710(P); and the error correcting code 721 may be used to decode the parity data 720 so as to correct errors possibly existing in the data 710(1) to 710(P) and the parity data 720.

In an exemplary embodiment, when it is intended to store at least part of data of the data 710(1) to 710(P), the multi-frame encoding corresponding to the data 710(1) to 710(P) is performed first so as to generate the parity data 720. Then, the single-frame encodings respectively corresponding to the data 710(1) to 710(P) and the parity data 720 are performed to generate the error correcting codes 711(1) to 711(P) and 721. In addition, the PUs for storing the parity data 720 may be different from the PU for storing any one of the data 710(1) to 710(P).

In an exemplary embodiment, when it is intended to store at least one of the data 710(1) to 710(P), the single-frame encodings respectively corresponding to the data 710(1) to 710(P) are performed first to generate the error correcting codes 711(1) to 711(P). Then, the multi-frame encoding corresponding to the data 710(1) to 710(P) and the error correction codes 711(1) to 711(P) is performed to generate the parity data 720 and the error correcting code 721. In this exemplary embodiment, the error correcting code 721 may also be regarded as being included in the parity data 720 and is thus usable for decoding the error correcting code 711(1) to 711(P).

In an exemplary embodiment, the parity data 720 may be referred to as a RAID (Redundant Array of Independent Disks) error correcting code, and the parity data 720 is generated according to an encoding rule of the RAID error correcting code. For example, the data 710(1) to 710(P) may be encoded by using the encoding rule of the RAID error correcting code to generate the parity data 720. In addition, in an exemplary embodiment, the data 710(1) to 710(P) and the parity data 720 may be collectively regarded to as one block code. Alternatively, in an exemplary embodiment, the data 710(1) to 710(P), the parity data 720, the error correcting codes 711(1) to 711(P) and 721 may also be collectively regarded to as one block code.

Figure 8A:
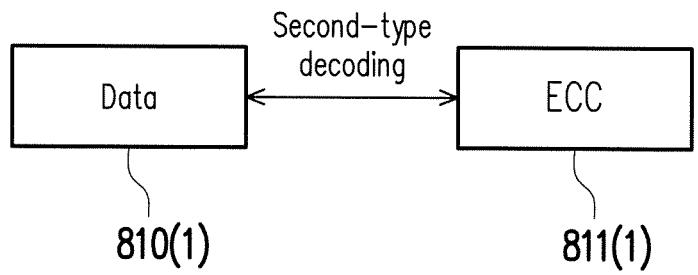
FIG. 8A is a schematic diagram illustrating a second-type decoding operation according to an exemplary embodiment of the invention.
Figure 8B:
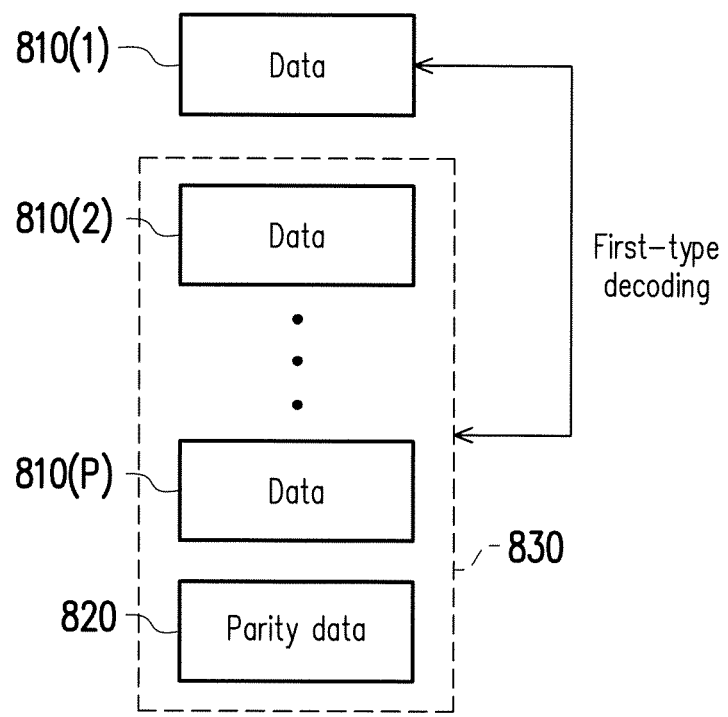
FIG. 8B is a schematic diagram illustrating a first-type decoding operation according to an exemplary embodiment of the invention.
Figure 8C:
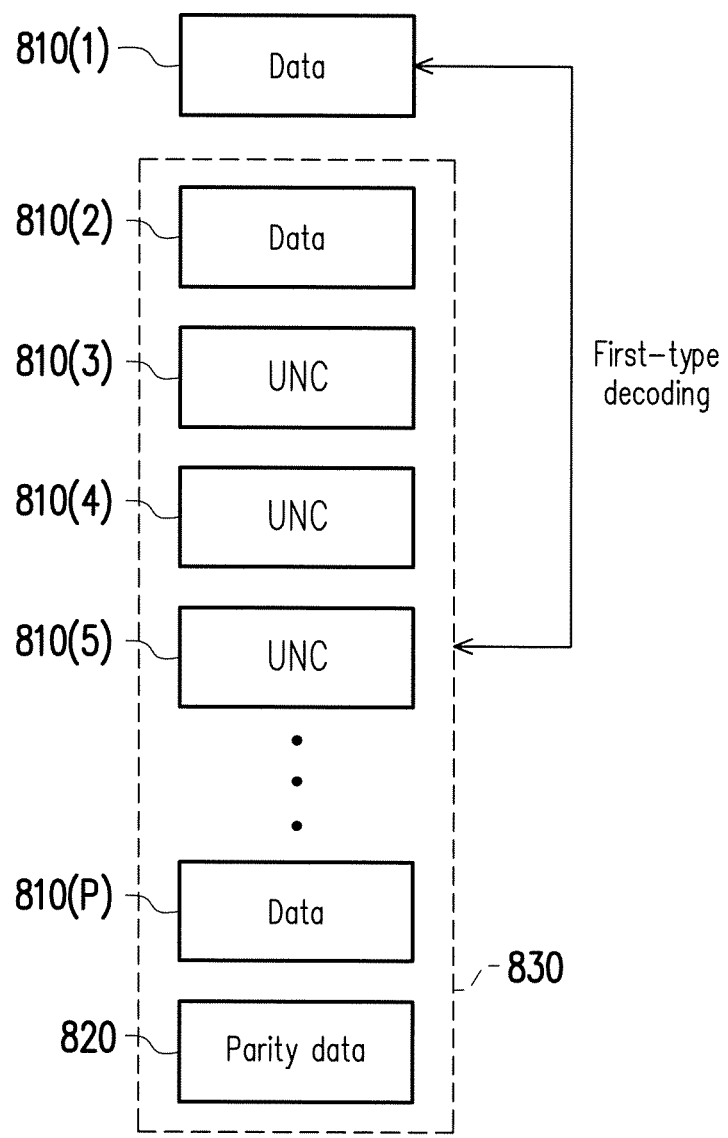
FIG. 8C is a schematic diagram illustrating a first-type decoding operation according to another exemplary embodiment of the invention.

FIG. 8A is a schematic diagram illustrating a second-type decoding operation according to an exemplary embodiment of the invention. FIG. 8B is a schematic diagram illustrating a first-type decoding operation according to an exemplary embodiment of the invention. FIG. 8C is a schematic diagram illustrating a first-type decoding operation according to another exemplary embodiment of the invention.

With reference to FIG. 8A, in an exemplary embodiment, the single-frame decoding is also known as a second-type decoding operation. When it is intended to perform the single-frame decoding for data 810(1), an error correcting code 811(1) previously generated by performing the single-frame encoding for the data 810(1) may also be read together. Then, in the single-frame decoding corresponding to the data 810(1), based on the error correcting code 811(1), the data 810(1) may be decoded and corrected. In an exemplary embodiment, the data 810(1) is also known as target data to be corrected in the corresponding single-frame decoding. If the data 810(1) is successfully decoded and corrected by the single-frame decoding, it means that the corresponding single-frame decoding is successful.

With reference to FIG. 8B, in an exemplary embodiment, the multi-frame decoding is also known as a first-type decoding operation. When it is intended to perform the multi-frame decoding for the data 810(1), data 830 may be read together. The data 830 (or the data 810(1) and 830) may be regarded as a data set. The data 830 includes data 810(2) to 810(P) and parity data 820 generated by performing the multi-frame encoding for the data 810(1) to 810(P). Then, in the multi-frame decoding corresponding to the data 810(1), based on the data 830, the data 810(1) may be decoded and corrected. In an exemplary embodiment, the data 810(1) is also known as the target data to be corrected in the corresponding multi-frame decoding. If the data 810(1) is successfully decoded and corrected by the multi-frame decoding, it means that the corresponding multi-frame decoding is successful. In an exemplary embodiment, each of the target data and the corresponding data set may be independently read. In an exemplary embodiment, the target data is included in the corresponding data set to be read together.

In an exemplary embodiment, the target data and/or the data set in the first-type decoding operation may include a data unit including an uncorrectable (abbr. UNC) error. Taking FIG. 8C for example, it is assumed that one data unit refers one frame, each of the data 810(1) to 810(P) may be regarded as one data unit. The UNC error refers to an error in the data unit that cannot be corrected by the corresponding single-frame decoding. If the data 810(3), 810(4) and 810(5) cannot be corrected by the corresponding single-frame decodings, each of the data 810(3), 810(4) and 810(5) may be regarded as an a data unit having the UNC error (a.k.a. an UNC error-included data unit). Further, if the data 810(2) and 810(P) can be corrected by the corresponding single-frame decodings, the data 810(2) and 810(P) may be regarded as a data unit not having the UNC error (a.k.a. an UNC error-excluded data unit).

In an exemplary embodiment, the first-type decoding operation includes a soft RAID decoding mode and an erasure mode. According to a number of the UNC error-included data units in the data to be decoded (e.g., the data 810(1) and the data 830 in FIG. 8C), the first-type decoding operation may be determined to be operated in the soft RAID decoding mode or the erasure mode. In an exemplary embodiment, if the number of the UNC error-included data units in the data to be decoded is not less than a default value (e.g., 2, but not limited thereto), the first-type decoding operation performed corresponding to the data to be decoded may be operated in the soft RAID decoding mode. However, if the number of the UNC error-included data units in the data to be decoded is less than the predetermined value, the first-type decoding operation performed corresponding to the data to be decoded may be operated in the erasure mode. In the erasure mode, the first-type decoding operation can usually guarantee the completion of decoding and correction for the target data.

In an exemplary embodiment, the MMC 502 may receive a read command from the host system 11. The read command may give an instruction for reading data of a logical unit. According to the read command, the MMC 502 can send a read command sequence to instruct the RVNM module 406 to read data (a.k.a. first data) from a PU mapped to the logical unit by using at least one read voltage level. After obtaining the first data (i.e., the target data), the ECCC 508 may perform the second-type decoding operation for the first data. If the second-type decoding operation is failed (e.g., the first data includes the UNC error), the MMC 502 can send a read command sequence to instruct the RVNM module 406 to read a data set corresponding to the first data from at least two PUs by using at least one read voltage level. Taking FIG. 8B for example, if the first data is the data 810(1), the data set corresponding to the first data may be the data 830 (or the data 810(1) and 830). In addition, the data 810(2) to 810(P) are also known as second data. The ECCC 508 can perform the second-type decoding operation for each of the data 810(2) to 810(P) and the parity data 820.

In an exemplary embodiment, the second-type decoding operation performed for data in a specific data set can facilitate in determining the number of the UNC error-included data units in the specific data set. For example, if a specific data unit in such data set is uncorrectable by the second-type decoding operation corresponding to the specific data unit, the specific data unit is determined as the UNC error-included data unit. Conversely, if a specific data unit in such data set is correctable by the second-type decoding operation corresponding to the specific data unit, the specific data unit is determined as the UNC error-excluded data unit.

In an exemplary embodiment, the MMC 502 can determine whether the data set corresponding to the first data conforms to a default condition. For example, the MMC 502 can determine whether the number of the UNC error-included data units in the data set corresponding to the first data is not less than a default value (e.g., 1 or 2). If the number of the UNC error-included data units in such data set is not less than the default value, the MMC 502 can determine that the data set conforms to the default condition. Otherwise, if the number of the UNC error-included data units in the data set is less than the default value, the MMC 502 can determine that the data set does not conform to the default condition.

If the data set corresponding to the first data conforms to the default condition, the ECCC 508 can enter the soft RAID decoding mode and perform the first-type decoding operation for the first data based on the data set in the soft RAID decoding mode. Further, if the data set corresponding to the first data does not conform to the default condition, the ECCC 508 can enter the erasure mode and perform the first-type decoding operation for the first data based on the data set in the erasure mode. Details regarding the first-type decoding operation performed for the first data based on the data set in the erasure mode may refer to the exemplary embodiments of FIG. 7 and FIG. 8B, which are not repeated hereinafter. In addition, the target data and the data set used by the ECCC 508 in the first-type decoding operation are all decoded by the corresponding second-type decoding operation previously, and thus errors in the target data and the data set may have been initially reduced.

Compared to the erasure mode, in the soft RAID decoding mode of the first-type decoding operation, the ECCC 508 performs the first-type decoding operation for the first data by using the data set and also records decoding information of the first-type decoding operation. For example, the ECCC 508 can record a decoding result and/or a correcting result of the first-type decoding operation for the first data. The recorded decoding information can reflect a bit value of at least one specific bit in the first data being changed in the first-type decoding operation performed. For example, an original bit value 0 of one specific bit may be changed into a bit value 1, or an original bit value 1 of one specific bit may be changed into a bit value 0.

According to the recorded decoding information, the MMC 502 can adjust reliability information corresponding to the first data. It is noted that, the reliability information corresponding to the first data mentioned herein is not used in the first-type decoding operation (but only used in the second-type decoding operation), and the adjusted reliability information is different from default reliability information (or original reliability information) corresponding to the first data. Nonetheless, in the erasure mode, the first-type decoding operation can usually guarantee the completion of decoding and correction for the target data. Therefore, in an exemplary embodiment, if the first-type decoding operation is performed in the erasure mode, it is not required to record the decoding information of the first-type decoding operation.

Figure 9:
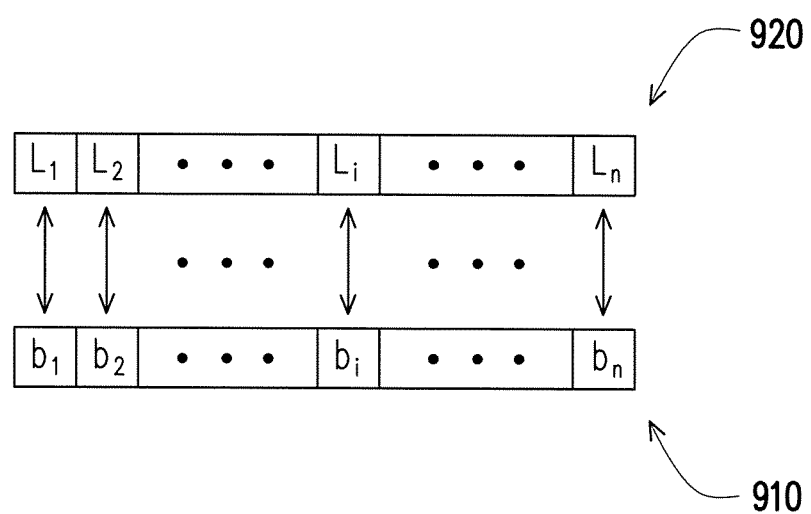
FIG. 9 is a schematic diagram illustrating first data and the corresponding reliability information according to an exemplary embodiment of the invention.
Figure 10:
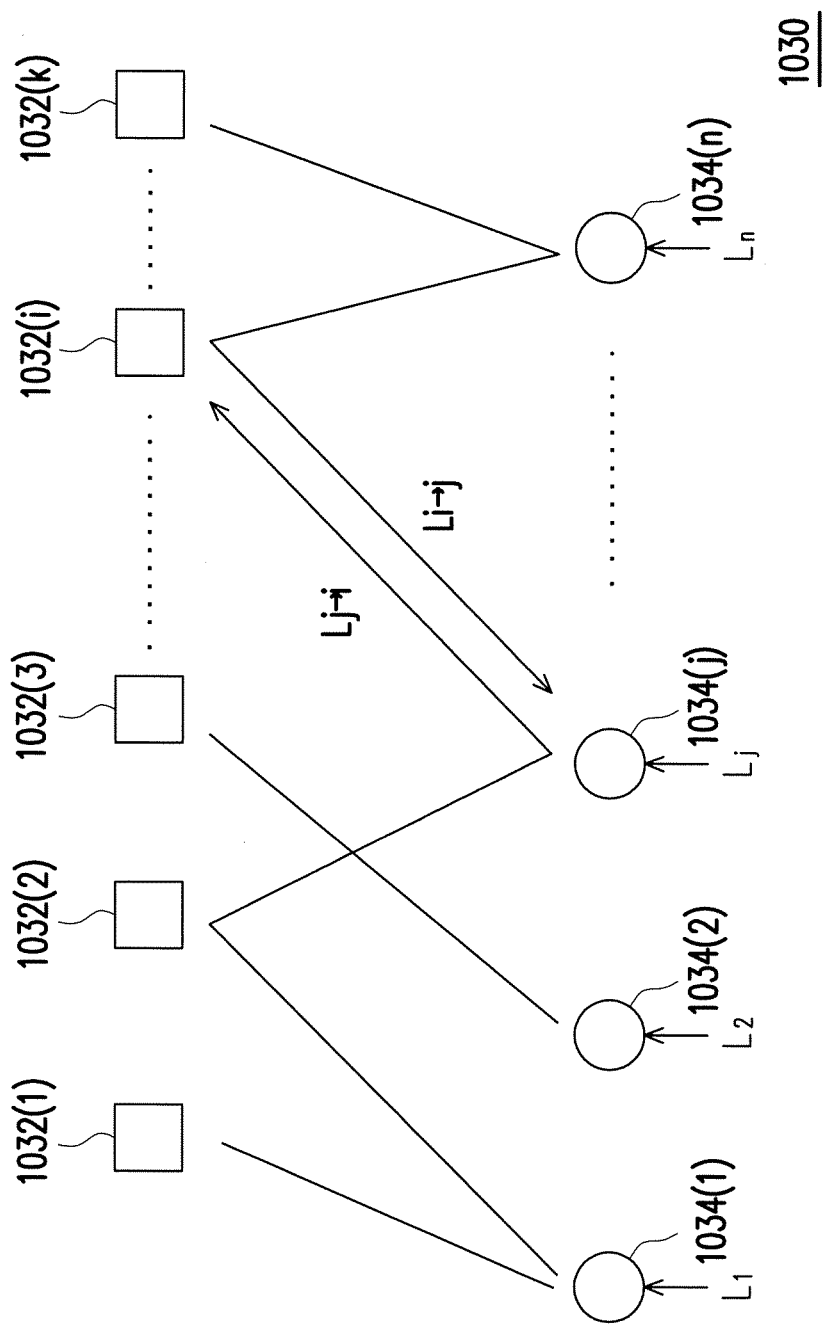
FIG. 10 is a schematic diagram illustrating a bipartite graph according to an exemplary embodiment of the invention.

FIG. 9 is a schematic diagram illustrating first data and the corresponding reliability information according to an exemplary embodiment of the invention. FIG. 10 is a schematic diagram illustrating a bipartite graph according to an exemplary embodiment of the invention.

With reference to FIG. 9, assuming that data 910 (i.e., the first data) includes bits $b_1$ to $b_n$, and reliability information 920 (a.k.a. channel reliability information) corresponding to the data 910 includes reliability information $L_1$ to $L_n$. The bit $b_i$ (a.k.a. a first bit) corresponds to the reliability information $L_i$ (a.k.a. first reliability information), where i is between 1 and n. In the second-type decoding operation, the reliability information $L_i$ affects a probability of the bit $b_i$ being decoded into a specific bit value (0 or 1).

With reference to FIG. 10, in a low density parity check code, a valid codeword is defined by using a parity check matrix H. During encoding, the parity check matrix H may be used to encode to-be-stored data in order to generate the corresponding error correcting code. In general, the parity check matrix H may be represented by a bipartite graph 1030, which includes parity nodes 1032(1) to 1032(k) and message nodes 1034(1) to 1034(n). Each of the parity nodes 1032(1) to 1032(k) corresponds to one syndrome, and each of the message nodes 1034(1) to 1034(n) corresponds to one data bit. Correspondence relations between the data bits and the syndromes (i.e., connections between the message nodes 1034(1) to 1034(n) and the parity nodes 1032(1) to 1032(k)) are generated according to the parity check matrix H. For example, if an element at an $i^{th}$ row and a $j^{th}$ column in the parity check matrix H is 1, an $i^{th}$ parity node 1032(i) is connected to a $j^{th}$ message node 1034(j), where i and j are positive integers.

While the MMC 502 is reading the data 910 from the RVNM module 406, the MMC 502 also obtains the reliability information 920. Here, the initially obtained reliability information may be referred to as the default reliability information (or the original reliability information). The reliability information is used to indicate a probability (or known as a reliance level) of the corresponding data bit being decoded into "1" or "0". For example, the reliability information $L_i$ may be used to indicate the probability for the bit $b_i$ to be decoded into "1" or "0". In the bipartite graph 1030, the message nodes 1034(1) to 1034(n) receive the corresponding reliability information. For example, the message node 1034(1) receives the reliability information $L_1$ of a first data bit, and the message node 1034(j) receives reliability information $L_j$ of a $j^{th}$ data bit.

The ECCC 508 can perform the second-type decoding operation according a structure of the bipartite graph 1030 and the reliability information $L_1$ to $L_n$. For example, the second-type decoding operation includes an iterative decoding. In the iterative decoding, the message nodes 1034(1) to 1034(n) calculate the reliability information for the parity nodes 1032(1) to 1032(k), and the parity nodes 1032(1) to 1032(k) also calculate the reliability information for the message nodes 1034(1) to 1034(n). The reliability information is transmitted along edges in the bipartite graph 1030. For example, what transmitted from the parity node 1032(i) to the message node 1034(j) is the reliability information $L_{i \to j}$, and what transmitted from the message node 1034(j) to the parity node 1032(i) is the reliability information $L_{j \to i}$. The reliability information are used to indicate the probability of one specific data bit being decoded into "1" or "0" as deemed by one node. For example, the reliability information $L_{j \to i}$ indicates the reliance level (which may be positive or negative) of the $j^{th}$ data bit being decoded into "1" or "0" deemed by the message node 1034(j), and the reliability information $L_{i \to j}$ indicates the reliance level of the $j^{th}$ data bit being decoded into "1" or "0" deemed by the parity node 1032(i). Further, the message nodes 1034(1) to 1034(n) and the parity nodes 1032(1) to 1032(k) calculate reliability information to be outputted according to the reliability information being inputted similar to calculating a conditional probability of one specific data bit being decoded into "1" or "0". Therefore, aforesaid process of transmitting the reliability information is also known as a belief propagation.

Based on different algorithms, the message nodes 1034(1) or 1034(n) and/or the parity nodes 1032(1) to 1032(k) can calculate reliability information in different forms. For example, the ECCC 508 can adopt algorithms including a Sum-Product Algorithm or a Min-Sum Algorithm, which are not particularly limited by the invention.

In each iteration of the iterative decoding, the message nodes 1034(1) to 1034(n) transmit the reliability information to the parity nodes 1032(1) to 1032(k), and the parity nodes 1032(1) to 1032(k) also transmit the reliability information to the message nodes 1034(1) to 1034(n). After each iteration, the message nodes 1034(1) to 1034(n) calculate the probability of each data bit being decoded into "1"or "0" according to the current reliability information. After a parity checking procedure is performed on the calculated data bits (e.g., by multiplying the codeword formed by data bit with the parity check matrix), whether the codeword is the valid codeword can be determined. If the generated codeword is the valid codeword, it means that the decoding succeeds, and the iteration decoding will stop. However, if the generated codeword is not the valid codeword, the next iteration will be performed. If an iteration count of the iterative decoding reaches one default value, it means that the decoding fails and the iteration decoding will also stop.

In the present exemplary embodiment, the reliability information includes a log likelihood ratio (LLR). For example, each of the reliability information $L_1$ to $L_n$, $L_{i \to j}$ and $L_{j \to i}$ in FIG. 9 and FIG. 10 is one log likelihood ratio. In general, an absolute value of the log likelihood ratio (may be positive or negative) of one data bit being greater means that the reliability of such data bit is higher, such that the current value of such data bit has the higher probability of being deemed as correct. Conversely, when the absolute value of one data bit is smaller, it means that the reliability of such data bit is lower, such that the current value of such data bit has higher probability of being deemed as incorrect and may thus be corrected in the current iteration decoding. In an exemplary embodiment, the default reliability information (e.g., the log likelihood ratio) corresponding one specific data bit is obtained by a table look-up. Alternatively, in another exemplary embodiment, the default reliability information corresponding to a specific data bit may also be generated by a dynamical calculation according to a specific algorithm.

Figure 11:
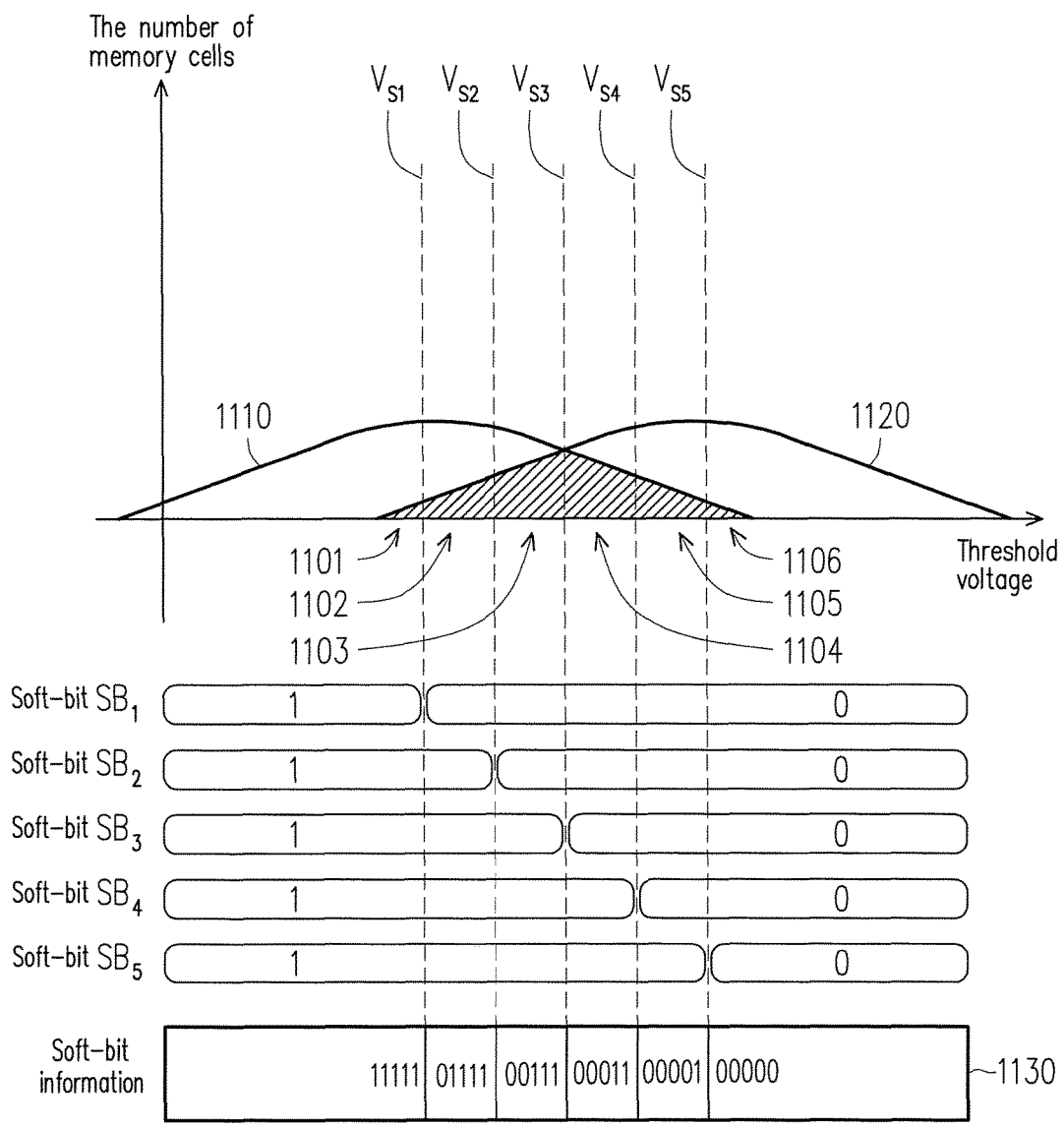
FIG. 11 is a schematic diagram illustrating a threshold voltage distribution of memory cells in first physical unit according to an exemplary embodiment of the invention.

FIG. 11 is a schematic diagram illustrating a threshold voltage distribution of memory cells in first PU according to an exemplary embodiment of the invention. With reference to FIG. 11, it is assumed that the first data is read from a specific PU (a.k.a. a first PU), and states 1110 and 1120 are at least part of a threshold voltage distribution of memory cells (a.k.a. first memory cells) for storing the first data in the first PU. The states 1110 and 1120 cover a plurality of voltage ranges 1101 to 1106. These voltage ranges 1101 to 1106 are segmented by read voltage levels $V_{S1}$ to $V_{S5}$ (a.k.a. soft-decision read voltage levels).

In an exemplary embodiment, the MMC 502 can identify which voltage range among the voltage ranges 1101 to 1106 does a threshold voltage belong to for each memory cell among the first memory cells. For example, the MMC 502 can send a read command sequence (a.k.a. a soft-decision read command sequence) to the RVNM module 406. According to the soft-decision read command sequence, the RVNM module 406 can use the read voltage levels $V_{S1}$ to $V_{S5}$ to read the first memory cells and transmit the obtained soft-bit information 1130 to the MMC 502. For example, the soft-bit information 1130 contains soft-bits $S_{B1}$ to $S_{B5}$ obtained by reading one specific memory cell among the first memory cells by using the read voltage levels $V_{S1}$ to $V_{S5}$. Further, in an exemplary embodiment, before transmitting the soft-bit information to the MMC 502, the RVNM module 406 can also perform a logical operation for at least part of the soft-bits corresponding to the same memory cell, so as to reduce a total number of the soft-bits to be transmitted.

According to the soft-bit information 1130, the MMC 502 can identify which voltage range among the voltage ranges 1101 to 1106 does the threshold voltage of one specific memory belong to. For example, if the soft-bit information 1130 corresponding to one memory cell is "11111"; the MMC 502 can identify that the threshold voltage of such memory cell belongs to the voltage range 1101; if the soft-bit information 1130 corresponding to one memory cell is "01111"; the MMC 502 can identify that the threshold voltage of such memory cell belongs to the voltage range 1102; if the soft-bit information 1130 corresponding to one memory cell is "00111"; the MMC 502 can identify that the threshold voltage of such memory cell belongs to the voltage range 1103; if the soft-bit information 1130 corresponding to one memory cell is "00011"; the MMC 502 can identify that the threshold voltage of such memory cell belongs to the voltage range 1104; if the soft-bit information 1130 corresponding to one memory cell is "00001"; the MMC 502 can identify that the threshold voltage of such memory cell belongs to the voltage range 1105; or, if the soft-bit information 1130 corresponding to one memory cell is "00000"; the MMC 502 can identify that the threshold voltage of such memory cell belongs to the voltage range 1106.

It is noted that, in an exemplary embodiment of FIG. 11, one of the read voltage levels $V_{S1}$ to $V_{S5}$ is set as a sign read voltage level. The sign read voltage level is used to determine the bit value of the read data bit. For example, if the read voltage level $V_{S3}$ is the sign read voltage level, the bit value of the data bit stored by one memory cell may then be obtained by reading such memory cell by using the read voltage level $V_{S3}$. Furthermore, the MMC 502 can search a reliability information table according to the voltage range to which the threshold voltage of such memory cell belongs, so as to obtain the default reliability information corresponding to the bit read from such memory cell.

In an exemplary embodiment, according to the recorded decoding information, the MMC 502 can adjust the reliability information corresponding to the first data obtained by the operation of table look-up mentioned above. Taking FIG. 9 for example, it is assumed that before the first-type decoding operation corresponding to the data 910 (i.e., the first data) is performed, the bit $b_i$ in the data 910 is decoded as being a first bit value by the second-type decoding operation corresponding to the data 910. However, after the ECCC 508 enters the soft RAID decoding mode and performs the first-type decoding operation for the data 910 by using the data set corresponding to the data 910, the recorded decoding information shows that the bit $b_i$ is decoded and/or corrected in the first-type decoding operation as being a second bit value. Here, the first bit value is different from the second bit value. For example, if the first bit value is 1, then the second bit value is 0. Alternatively, if the first bit value is 0, then the second bit value is 1. In other words, in the first-type decoding operation, the bit value of the bit $b_i$ is changed.

In an exemplary embodiment, according to whether the bit value of the bit $b_i$ is changed in the first-type decoding operation, the MMC 502 can dynamically adjust the reliability information $L_i$. For example, the MMC 502 can increase the reliability information $L_i$ by an adjustment value (a.k.a. a first adjustment value) or decrease the reliability information $L_i$ by another adjustment value (a.k.a. a second adjustment value). The first adjustment value may be identical to or different from the second adjustment value. It is noted that, in the exemplary embodiment where the reliability information is the log likelihood ratio, because a value of the reliability information $L_i$ may be positive or negative, the operations of increasing or decreasing the reliability information $L_i$ are perform with respect to an absolute value of the reliability info nation $L_i$.

In an exemplary embodiment, if the bit value of the bit $b_i$ is not changed in the first-type decoding operation, the MMC 502 can increase the reliability information $L_i$ by the first adjustment value, for example, by adjusting from +3 to +6 (i.e., the first adjustment value is 3) or adjusting from −1 to −5 (i.e., the first adjustment value is 4). Alternatively, in an exemplary embodiment, if the bit value of the bit $b_i$ is changed in the first-type decoding operation, the MMC 502 can decrease the reliability information $L_i$ by the second adjustment value, for example, by adjusting from +3 to +1 (i.e., the second adjustment value is 2) or adjusting from −7 to −3 (i.e., the second adjustment value is 4). In addition, in one adjustment operation for the reliability information, the reliability information corresponding to at least one bit in the first data may be adjusted.

In an exemplary embodiment, the MMC 502 can also dynamically determine the first adjustment value or the second adjustment value according to the value of the current reliability information $L_i$. For example, the MMC 502 can determine whether the absolute value of the reliability information $L_i$ currently corresponding to the bit $b_i$ is greater than a threshold value. If the absolute value of the reliability information $L_i$ current corresponding to the bit $b_i$ is greater than the threshold value, the MMC 502 can increase the first adjustment value and/or the second adjustment value. Conversely, if the absolute value of the reliability information $L_i$ current corresponding to the bit $b_i$ is not greater than the threshold value, the MMC 502 can decrease the first adjustment value and/or the second adjustment value. By doing so, in an exemplary embodiment, when it is required to adjust the reliability information $L_i$, if the absolute value of the current reliability information $L_i$ is greater (e.g., greater than the threshold value or the value of the reliability information $L_i$ is farther from 0), then increment or decrement of the reliability information $L_i$ may be greater; otherwise, if the absolute value of the reliability information $L_i$ is smaller (smaller than the threshold value or the value of the reliability information $L_i$ is closer to 0), increment or decrement of the reliability information $L_i$ may be smaller.

It is noted that, in an exemplary embodiment, the operation of adjusting the first adjustment value and/or the second adjustment value may also be implemented by an algorithm or a table. In this way, the MMC 502 can input the value of the reliability information $L_i$ currently corresponding to the bit $b_i$ to the algorithm or the table so that an output of the algorithm or the table may be used as the adjusted reliability information $L_i$.

After adjusting the reliability information corresponding to the first data, the ECCC 508 can perform the second-type decoding operation for the first data again by using the adjusted reliability information. It is noted that, because the reliability information corresponding to the first data has been updated according to the decoding information of the previously performed first-type decoding operation, a decoding success rate of the second-type decoding operation performed again for the first data by using the adjusted reliability information may be improved.

In an exemplary embodiment, after the second-type decoding operation performed for the first data is failed, if there are still reliability information tables remained unused, the MMC 502 can obtain the default reliability information corresponding to the first data again by searching the unused reliability information tables according to the previously obtained soft-bit information (e.g., the soft-bit information 1130 in FIG. 11). Then, the MMC 502 can adjust the default reliability information again according to the previously recorded decoding information of the first-type decoding operation. Then, the ECCC 508 can perform the second-type decoding operation for the first data again by using the adjusted reliability information. In an exemplary embodiment, in the second-type decoding operations repeated performed for the first data, the reliability information used by the ECCC 508 may be different from one another, and the used reliability information may all be different from the default reliability information obtained by the table look-up.

It is noted that, in the soft RAID decoding mode of the first-type decoding operation, the first-type decoding operation may also be performed for the second data in the data set; decoding information of the first-type decoding operation corresponding to the second data may also be recorded; reliability information corresponding to the second data may also be adjusted according to the recorded decoding information; and the adjusted reliability information may be used in the second-type decoding operation the next time for the same second data. Specific operation details of the above are identical or similar to the operations for decoding the first data and adjusting the reliability information corresponding to the first data, which are not repeated hereinafter. For example, in an exemplary embodiment of FIG. 9, the data 910 may be considered as any data among the data 810(2) to 810(P) in FIG. 8C, and detailed operation regarding the same has been described above.

In an exemplary embodiment, after the first-type decoding operation in the soft RAID decoding mode and the second-type decoding operation are performed for the first data and/or at least part of remaining data in the corresponding data set, the MMC 502 can determine whether the data set conforms to the default condition again. If the data set conforms to the default condition (e.g., the number of the UNC error-included data units in the data set is not less than the default value), the ECCC 508 can enter the soft RAID decoding mode of the first-type decoding operation again, so as to perform the operations of decoding the data and adjusting the reliability information in the soft RAID decoding mode for the at least part of the remaining data in the data set. However, if the data set does not conform to the default condition (e.g., the number of the UNC error-included data units in the data set is less than default value), the ECCC 508 can enter the erasure mode and perform the first-type decoding operation for the first data based on the data set in the erasure mode.

Figure 12:
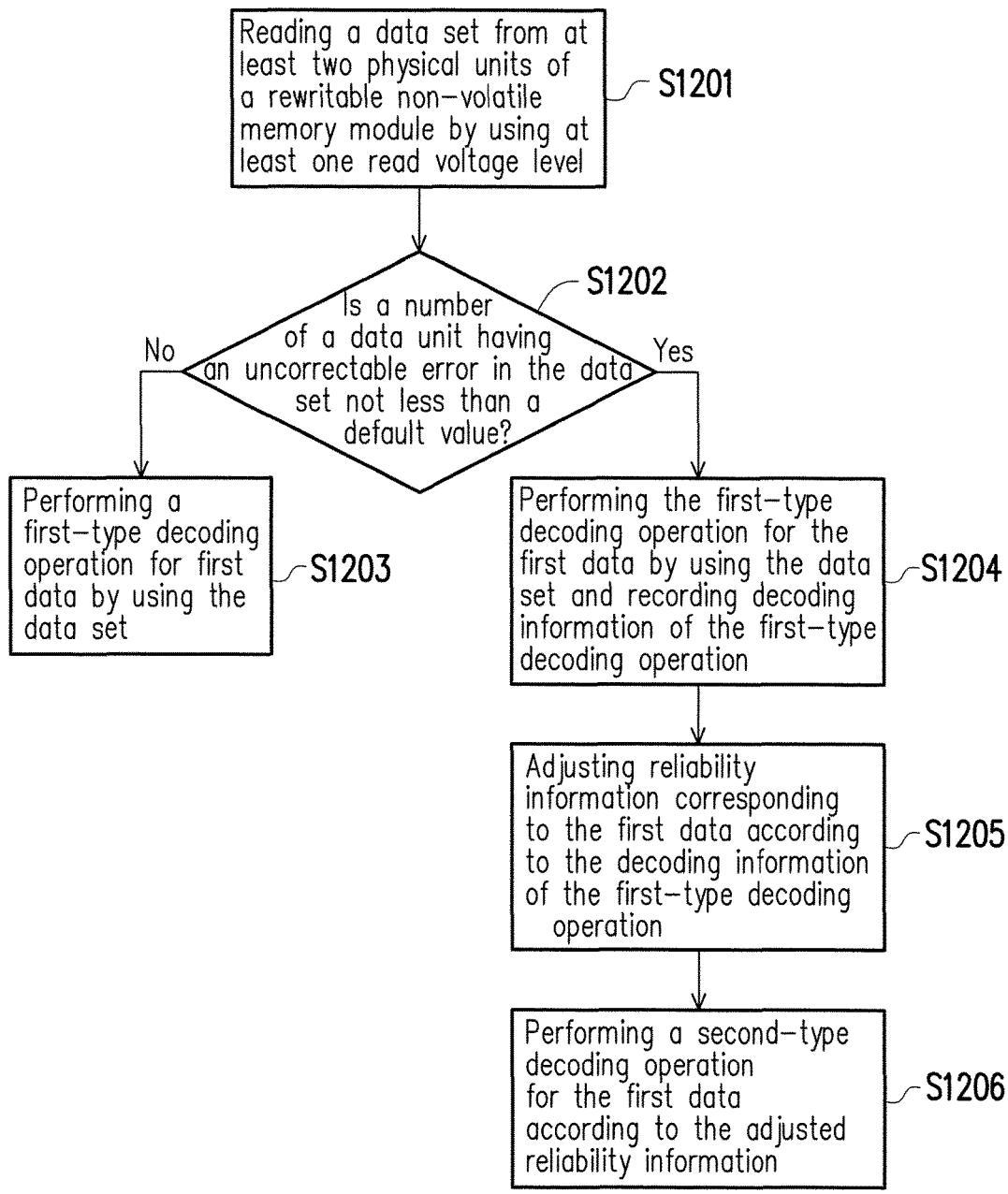
FIG. 12 is a flowchart illustrating a decoding method according to an exemplary embodiment of the disclosure.

FIG. 12 is a flowchart illustrating a decoding method according to an exemplary embodiment of the disclosure.

With reference to FIG. 12, in step S1201, a data set is read from at least two PUs of a RVNM module by using at least one read voltage level. In step S1202, whether a number of the data unit having an uncorrectable error in the data set is not less than a default value is determined. If the number of the data unit having the uncorrectable error in the data set is less than the default value, in step S1203, a first-type decoding operation is performed for first data by using the data set.

If the number of the data unit having the uncorrectable error in the data set is not less than the default value, in step S1204, the first-type decoding operation is performed for the first data by using the data set and decoding information of the first-type decoding operation is recorded. In step S1205, reliability information corresponding to the first data is adjusted according to the recorded decoding information of the first-type decoding operation. In step S1206, a second-type decoding operation is performed for the first data according to the adjusted reliability information.

Figure 13A:
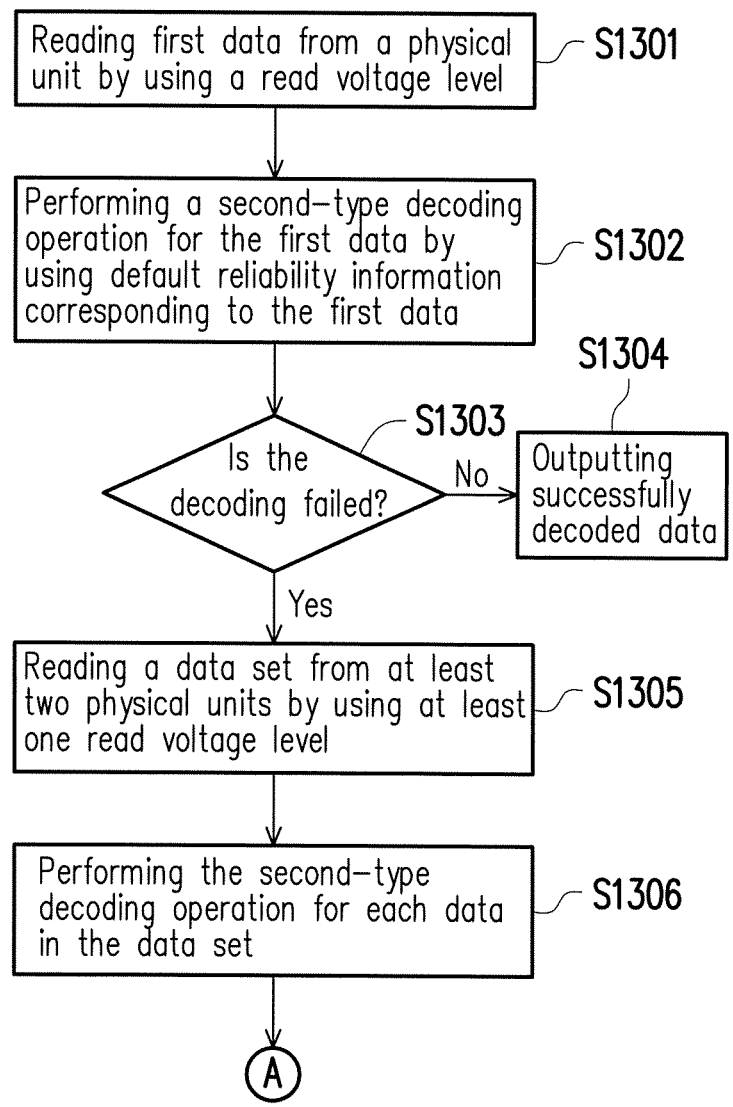
FIG. 13A and FIG. 13B are flowcharts illustrating a decoding method according to another exemplary embodiment of the invention.
Figure 13B:
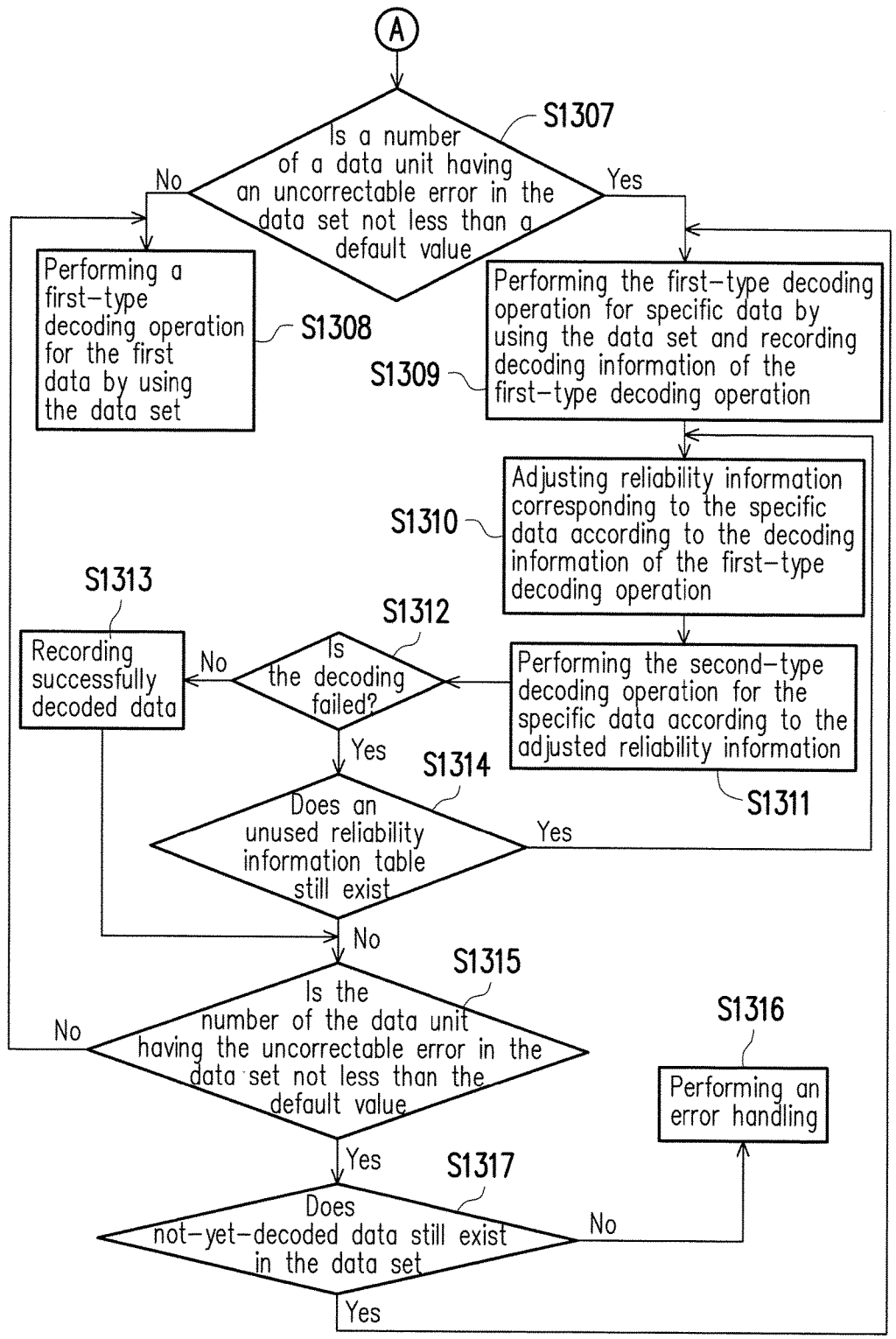

FIG. 13A and FIG. 13B are flowcharts illustrating a decoding method according to another exemplary embodiment of the invention.

With reference to FIG. 13A, in step S1301, first data is read from a PU by using a read voltage level. In step S1302, a second-type decoding operation is performed for the first data by using default reliability information corresponding to the first data. It is noted that, in another exemplary embodiment, it is also possible that the default reliability information corresponding to the first data is not used in the second-type decoding operation performed in step S1302, which is not particularly limited by the invention. In step S1303, whether a decoding for the first data is failed is determined. If the decoding for the first data is not failed, in step S1304, successfully decoded data is outputted. If the decoding for the first data is failed, in step S1305, a data set corresponding to the first data is read from at least two PUs by using at least one read voltage level. In step S1306, the second-type decoding operation is performed for each data in the data set and step S1307 is entered.

With reference to FIG. 13B, in step S1307, whether a number of data unit having an uncorrectable error in the data set is not less than a default value is determined. If the number of the data unit having the uncorrectable error in the data set is less than the default value, in step S1308, a first-type decoding operation is performed for the first data (i.e., the target data) by using the data set. If the number of the data unit having the uncorrectable error in the data set is not less than the default value, in step S1309, specific data in the data set is selected, the first-type decoding operation is performed for the specific data by using the data set, and decoding information of the first-type decoding operation is recorded. For example, the currently selected specific data may be the first data (i.e., the target data) or the remaining data (e.g., the second data) in the data set. In step S1310, reliability information corresponding to the specific data is adjusted according to the decoding information of the first-type decoding operation. In step S1311, the second-type decoding operation is performed for the specific data according to the adjusted reliability information.

In step S1312, whether a decoding for the specific data is failed is determined. If the decoding for the specific data is not failed, in step S1313, successfully decoded data is recorded. In an exemplary embodiment, entering step S1313 means that the specific data (i.e., the currently successfully decoded data) in the data set has been converted from the uncorrectable error-included data unit into an uncorrectable error-excluded data unit. Step S1315 may be performed following step S1313. Moreover, if the decoding for the specific data is failed, in step S1314, whether an unused reliability information table still exists is determined. If the unused reliability information table still exists, the method returns to step S1310, the reliability information corresponding to the specific data is obtained again according to the unused reliability information table and the reliability information corresponding to the specific data is adjusted again according to the previously recorded decoding information of the first-type decoding operation corresponding to the specific data. Then, step S1311 is executed again.

If it is determined that the unused reliability information table does not exist in step S1314, whether the number of the data unit having the uncorrectable error in the data set is not less than the default value is determined in step S1315. If the number of the data unit having the uncorrectable error in the data set is less than the default value, the method proceeds to step S1308. If the number of the data unit having the uncorrectable error in the data set is not less than the default value, in step S1317, whether not-yet-decoded data still exists in the data set is determined. If the not-yet-decoded data still exists in the data set, the method returns to step S1309 in which the not-yet-decoded data in the data set is set as the specific data, and then the method proceeds to step S1309 to S1312 so as to convert the remaining uncorrectable error-included data unit in the data set into the uncorrectable error-excluded data units. In addition, if it is determined that the not-yet-decoded data does not exist in the data set in step S1317, it is determined that the decoding is failed and an error handling is performed (e.g., returning a read error message back to the host system) in step S1316.

Nevertheless, steps depicted in FIG. 12, FIG. 13A and FIG. 13B have been described in details above, which are repeated hereinafter. It is noted that, the steps depicted in FIG. 12, FIG. 13A and FIG. 13B may be implemented as a plurality of program codes or circuits, which are not particularly limited in the invention. Moreover, the methods disclosed in FIG. 12, FIG. 13A and FIG. 13B may be implemented with reference to the foregoing embodiments, or may be implemented separately, which are not particularly limited in the invention.

In summary, after the data set is read from the at least two PUs, the data set can be used in the first-type decoding operation in order to decode the specific data in the data set and the decoding information of the first-type decoding operation can be recorded. Then, according to the recorded decoding information, the reliability information corresponding to the specific data can be adjusted, and the adjusted reliability information can be used in the subsequent second-type decoding operation for the specific data.

As a result, the decoding success rate of a compound decoding operation including the multi-frame decoding and the single-frame decoding for the data set including the uncorrectable error-included data unit may be improved, and the decoding efficiency of the data protection mechanism across PUs may also be improved.

The previously described exemplary embodiments of the present disclosure have the advantages aforementioned, wherein the advantages aforementioned not required in all versions of the disclosure.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A decoding method for a rewritable non-volatile memory module, wherein the rewritable non-volatile memory module comprises a plurality of physical units, and the decoding method comprises:
   reading a data set from at least two physical units among the physical units by using at least one read voltage level;
   performing a first-type decoding operation for first data by using the data set and recording decoding information of the first-type decoding operation if the data set conforms to a default condition;
   adjusting reliability information corresponding to the first data according to the decoding information of the first-type decoding operation, wherein the reliability information corresponding to the first data is not used in the first-type decoding operation, and the adjusted reliability information is different from default reliability information corresponding to the first data; and
   performing a second-type decoding operation for the first data according to the adjusted reliability information.

2. The decoding method of claim 1, wherein the data set comprises second data and parity data, wherein the first-type decoding operation comprises decoding the first data by using the second data and the parity data, wherein the physical units for storing the first data, the second data and the parity data are different from one another.

3. The decoding method of claim 1, further comprising:
   determining that the data set conforms to the default condition if a number of a data unit having an uncorrectable error in the data set is not less than a default value.

4. The decoding method of claim 3, further comprising:
   determining that a specific data unit in the data set is the data unit having the uncorrectable error if the specific data unit is uncorrectable by the second-type decoding operation corresponding to the specific data unit.

5. The decoding method of claim 1, wherein a probability of a first bit in the first data being decoded into a specific bit value in the second-type decoding operation corresponding to the first data is at least affected by the reliability information corresponding to the first data.

6. The decoding method of claim 1, wherein the step of adjusting the reliability information corresponding to the first data according to the decoding information of the first-type decoding operation comprises:
   adjusting the reliability information corresponding to the first data according to whether the first-type decoding operation changes a bit value of a first bit in the first data.

7. The decoding method of claim 1, wherein the reliability information corresponding to the first data comprises first reliability information corresponding to a first bit in the first data, and the step of adjusting the reliability information corresponding to the first data according to the decoding information of the first-type decoding operation comprises:
   increasing the first reliability information by a first adjustment value or decreasing the first reliability information by a second adjustment value according to the decoding information of the first-type decoding operation.

8. The decoding method of claim 7, further comprising:
   dynamically determining the first adjustment value or the second adjustment value according to the first reliability information currently corresponding to the first bit.

9. The decoding method of claim 1, further comprising:
   performing the second-type decoding operation for the first data by using the default reliability information corresponding to the first data before the first-type decoding operation for the first data is performed by using the data set.

10. A memory storage device, comprising:
    a connection interface unit, configured to couple to a host system;
    a rewritable non-volatile memory module, wherein the rewritable non-volatile memory module comprises a plurality of physical units; and
    a memory control circuit unit, coupled to the connection interface unit and the rewritable non-volatile memory module,
    wherein the memory control circuit unit is configured to give an instruction for reading a data set from at least two physical units among the physical units by using at least one read voltage level,
    wherein the memory control circuit unit is further configured to perform a first-type decoding operation for first data by using the data set and record decoding information of the first-type decoding operation if the data set conforms to a default condition,
    wherein the memory control circuit unit is further configured to adjust reliability information corresponding to the first data according to the decoding information of the first-type decoding operation, wherein the reliability information corresponding to the first data is not used in the first-type decoding operation, and the adjusted reliability information is different from default reliability information corresponding to the first data,
    wherein the memory control circuit unit is further configured to perform a second-type decoding operation for the first data according to the adjusted reliability information.

11. The memory storage device of claim 10, wherein the data set comprises second data and parity data, wherein the first-type decoding operation comprises decoding the first data by using the second data and the parity data, wherein the physical units for storing the first data, the second data and the parity data are different from one another.

12. The memory storage device of claim 10, wherein the memory control circuit unit is further configured to determine that the data set conforms to the default condition if a number of a data unit having an uncorrectable error in the data set is not less than a default value.

13. The memory storage device of claim 12, wherein the memory control circuit unit is further configured to determine that a specific data unit in the data set is the data unit having the uncorrectable error if the specific data unit is uncorrectable by the second-type decoding operation corresponding to the specific data unit.

14. The memory storage device of claim 10, wherein a probability of a first bit in the first data being decoded into a specific bit value in the second-type decoding operation corresponding to the first data is at least affected by the reliability information corresponding to the first data.

15. The memory storage device of claim 10, wherein the operation of adjusting the reliability information corresponding to the first data according to the decoding information of the first-type decoding operation by the memory control circuit unit comprises:
    adjusting the reliability information corresponding to the first data according to whether the first-type decoding operation changes a bit value of a first bit in the first data.

16. The memory storage device of claim 10, wherein the reliability information corresponding to the first data comprises first reliability information corresponding to a first bit in the first data, and the operation of adjusting the reliability information corresponding to the first data according to the decoding information of the first-type decoding operation by the memory control circuit unit comprises:
    increasing the first reliability information by a first adjustment value or decreasing the first reliability information by a second adjustment value according to the decoding information of the first-type decoding operation.

17. The memory storage device of claim 16, wherein the memory control circuit unit is further configured to dynamically determine the first adjustment value or the second adjustment value according to the first reliability information currently corresponding to the first bit.

18. The memory storage device of claim 10, wherein the memory control circuit unit is further configured to perform the second-type decoding operation for the first data by using the default reliability information corresponding to the first data before performing the first-type decoding operation for the first data by using the data set.

19. A memory control circuit unit for controlling a rewritable non-volatile memory module, wherein the rewritable non-volatile memory module comprises a plurality of physical units, wherein the memory control circuit unit comprises:
    a host interface, configured to couple to a host system,
    a memory interface, configured to couple to the rewritable non-volatile memory module;
    an error checking and correcting circuit; and
    a memory management circuit, coupled to the host interface, the memory interface and the error checking and correcting circuit,
    wherein the memory management circuit is configured to give an instruction for reading a data set from at least two physical units among the physical units by using at least one read voltage level,
    wherein the error checking and correcting circuit is configured to perform a first-type decoding operation for first data by using the data set and record decoding information of the first-type decoding operation if the data set conforms to a default condition,
    wherein the memory management circuit is further configured to adjust reliability information corresponding to the first data according to the decoding information of the first-type decoding operation, wherein the reliability information corresponding to the first data is not used in the first-type decoding operation, and the adjusted reliability information is different from default reliability information corresponding to the first data,
    wherein the memory management circuit is further configured to perform a second-type decoding operation for the first data according to the adjusted reliability information.

20. The memory control circuit unit of claim 19, wherein the data set comprises second data and parity data, wherein the first-type decoding operation comprises decoding the first data by using the second data and the parity data, wherein the physical units for storing the first data, the second data and the parity data are different from one another.

21. The memory control circuit unit of claim 19, wherein the memory management circuit is further configured to determine that the data set conforms to the default condition if a number of a data unit having an uncorrectable error in the data set is not less than a default value.

22. The memory control circuit unit of claim 21, wherein the memory management circuit is further configured to determine that a specific data unit in the data set is the data unit having the uncorrectable error if the specific data unit is uncorrectable by the second-type decoding operation corresponding to the specific data unit.

23. The memory control circuit unit of claim 19, wherein a probability of a first bit in the first data being decoded into a specific bit value in the second-type decoding operation corresponding to the first data is at least affected by the reliability information corresponding to the first data.

24. The memory control circuit unit of claim 19, wherein the operation of adjusting the reliability information corresponding to the first data according to the decoding information of the first-type decoding operation by the memory management circuit comprises:
    adjusting the reliability information corresponding to the first data according to whether the first-type decoding operation changes a bit value of a first bit in the first data.

25. The memory control circuit unit of claim 19, wherein the reliability information corresponding to the first data comprises first reliability information corresponding to a first bit in the first data, and the operation of adjusting the reliability information corresponding to the first data according to the decoding information of the first-type decoding operation by the memory management circuit comprises:
    increasing the first reliability information by a first adjustment value or decreasing the first reliability information by a second adjustment value according to the decoding information of the first-type decoding operation.

26. The memory control circuit unit of claim 25, wherein the memory management circuit is further configured to dynamically determine the first adjustment value or the second adjustment value according to the first reliability information currently corresponding to the first bit.

27. The memory control circuit unit of claim 19, wherein the error checking and correcting circuit is further configured to perform the second-type decoding operation for the first data by using the default reliability information corresponding to the first data before performing the first-type decoding operation for the first data by using the data set.

* * * * *